(12) United States Patent
Furumiya et al.

(10) Patent No.: US 6,642,952 B2
(45) Date of Patent: Nov. 4, 2003

(54) LASER DRIVE METHOD AND LASER DRIVE SYSTEM

(75) Inventors: Shigeru Furumiya, Himeji (JP); Hisashi Senga, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 55 days.

(21) Appl. No.: 09/946,535

(22) Filed: Sep. 6, 2001

(65) Prior Publication Data

US 2002/0044197 A1 Apr. 18, 2002

(30) Foreign Application Priority Data

Sep. 7, 2000 (JP) ........................................ 2000-271098

(51) Int. Cl.[7] .............................. B41J 2/435; H01S 3/10
(52) U.S. Cl. .................................. 347/247; 372/29.021
(58) Field of Search ....................... 372/29.021; 347/247

(56) References Cited

U.S. PATENT DOCUMENTS 5,912,694 A * 6/1999 Miyake et al. .............. 347/247
6,259,466 B1 * 7/2001 Oomura et al. .............. 347/237

FOREIGN PATENT DOCUMENTS

JP          9-171631          6/1997

* cited by examiner

Primary Examiner—James Davie
(74) Attorney, Agent, or Firm—Wenderoth, Lind & Ponack, L.L.P.

(57) ABSTRACT

A pulse emitting laser is constantly controlled while recording data continuously to a desired power level without using test emissions or a high speed sample hold filter. The laser drive method detects beam emission power from a light source and generates a monitor wave; receives data and generates an expected wave for the beam power based on the received data; calculates the difference between the generated monitor wave and the expected wave; controls current flow from the bias current source based on the calculated waveform difference; and finally emits a beam from the light source based on the controlled current flow of the bias current source.

8 Claims, 9 Drawing Sheets

LASER DRIVE METHOD AND LASER DRIVE SYSTEM

BACKGROUND OF THE INVENTION

1. Field of the Invention

The present invention relates to drive control for a laser.

2. Description of Related Art

Lasers are used as the light source in optical disc drives such as commonly used for auxiliary storage in computer systems. Generally speaking, individual laser elements differ greatly in their characteristics, and the relationship between input current and output light power is not constant as a result of temperature change and aging of the laser element. Conventional optical disc drives therefore maintain a desired laser power using feedback power control to control output light power to a desired level while monitoring the emitted power. With a recordable optical disc drive the output power must be controlled while emitting the laser beam in pulses according to the data to be recorded (hereinafter referred to as "record data"), and various methods of accomplishing this have been proposed.

Broadly speaking, prior art methods for controlling the output power of a pulse-emitting laser can be grouped in two categories. The first category determines and remembers the current required for pulse emissions by emitting test beams when data is not being recorded, and then uses the stored current value to drive the laser when recording data. This is referred to as the test emission method. In the second category, a high speed sample hold circuit extracts a period in the record data where the laser power is locally constant, and discretely controls power during recording. This is referred to as the sample-hold method. This sample-hold method is more fully described in Japanese Patent Laid-open Publication (kokai) H09-171631.

Problems with the above two prior art methods are described below.

Although the test emission method determines the drive current, laser temperature gradually rises when data is recorded continuously for an extended time, and even if the current is held constant at the stored test current level, emission power gradually changes due to the change in laser temperature. To resolve this problem, a track format having an area (referred to as a "gap") for test emission disposed at regular intervals in the recording tracks is used, and the change in output power is suppressed to a negligible level by repeating the test emission at a regular time interval. An obvious drawback to this is that the area usable for data recording is reduced by the area of the gaps, and the storage efficiency of the recording medium thus drops.

With the sample hold method, the frequency characteristic of the emission strength monitor may not be sufficient when the frequency of the record data is increased in order to improve recording speed. In addition, extremely high response performance is required in the high speed sample hold circuit in this case, and this invites a cost increase due to the parts that must be used.

SUMMARY OF THE INVENTION

To resolve the above problems an object of the present invention is to constantly, continuously control the output power of a pulse-emitting laser to a desired level while recording data in an optical disc drive, and to so control the laser without using test emissions or a high speed sample hold circuit.

To achieve this object, a laser drive method according to the present invention comprises detecting beam emission power from a light source and generating a monitor wave; receiving data; generating an expected wave for the beam power based on the received data; calculating a waveform difference between the generated monitor wave and expected wave; controlling current flow from the bias current source based on the calculated waveform difference; and emitting a beam from the light source based on the controlled current flow of the bias current source.

Yet further preferably, the laser drive method further comprises detecting and outputting as a monitor amplitude a peak-to-bottom difference of the bandwidth-limited monitor wave; detecting and outputting as an expected amplitude a peak-to-bottom difference of the bandwidth-limited expected wave; determining an amplitude difference of the output monitor amplitude and the output expected amplitude; and adjusting the current flow of the pulse current source based on the determined amplitude difference.

To further achieve the above objects, a laser drive system according to the present invention has an emission power monitoring unit which detects beam emission power from a light source and generating a monitor wave; an expected waveform generating unit which receives data and based on the received data generating an expected wave for the beam power; a differential operator which calculates a waveform difference between the monitor wave generated by the emission power monitoring unit and the expected wave generated by the expected waveform generating unit; a bias current source which controls current flow based on the waveform difference calculated by the differential operator. The laser drive system then emits a beam from the light source based on the current flow controlled by the bias current source.

Yet further preferably, the laser drive system additionally has a monitor amplitude detecting unit which detects and outputs as a monitor amplitude the peak-to-bottom difference of the bandwidth-limited monitor wave; an expected amplitude detecting unit which detects and outputs as an expected amplitude the peak-to-bottom difference of the bandwidth-limited expected wave; an amplitude differential operator which determines an amplitude difference between the monitor amplitude output from the monitor amplitude detecting unit and the expected amplitude output from the expected amplitude detecting unit. In this case, the pulse current source adjusts the current flow based on the amplitude difference determined by the amplitude differential operator.

The laser drive method and laser drive system according to the present invention can constantly and continuously control the power of a pulse-emitting laser without using test emission feedback or a high speed sample hold circuit. The laser drive method and laser drive system of the present invention can therefore be used in an optical disc drive to achieve an extremely high data recording rate and recording efficiency.

Other objects and attainments together with a fuller understanding of the invention will become apparent and appreciated by referring to the following description and claims taken in conjunction with the accompanying drawings.

BRIEF DESCRIPTION OF THE DRAWINGS

These and other object and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
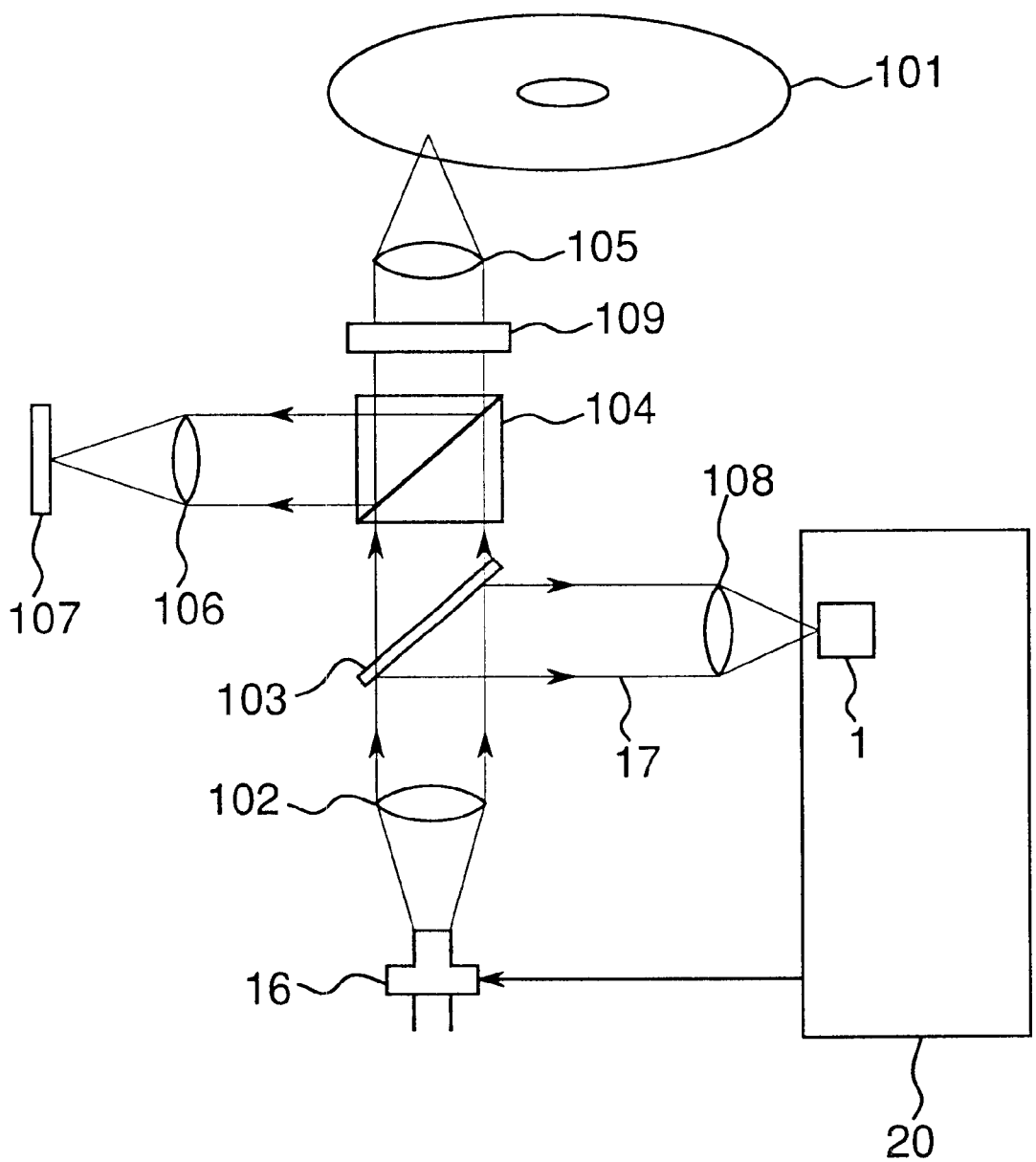
FIG. 1 is a partial schematic view of an optical disc drive having a laser drive unit according to the present invention.

Preferred embodiments of the present invention are described below with reference to the accompanying figures, in which functionally identical parts are identified by like reference numerals.

Embodiment 1

FIG. 1 is a partial schematic view of an optical disc drive 100 having a laser drive unit 20 according to the present invention. The optical disc drive 100 reads data recorded with an optical disc 101, and reproduces the data as information that can be seen or heard by a user or information that can be used by a computer. The optical disc drive 100 also records data to the optical disc 101 using a laser.

The data reading operation is described next with reference to FIG. 1. A laser beam emitted from the laser light source 16 of the optical disc drive 100 is collimated to parallel rays by a collimation lens 102, passed through a transparent mirror 103, polarized beam splitter 104, and quarter-wave plate 109, and converted to a convergent beam by objective lens 105. The convergent beam is then emitted to the optical disc 101 and collected at the data recording surface of the disc. The beam reflected from the data recording surface of the optical disc 101 then passes back through the quarter-wave plate 109. This changes the polarization direction of the reflected light. The reflected light then reaches the polarized beam splitter 104. The polarized beam splitter 104 reflects and extracts only the reconstructed light. The extracted light is then passed through the 106 and guided to the photodetector 107. The signal detected by the photodetector 107 is then reproduced as the read data signal.

The write operation is described next. The optical disc drive 100 adjusts the strength of the laser beam from the laser light source 16, and emits the laser beam to a specific position on the optical disc 101 for a specific time only. This laser beam emission causes a change in the physical characteristics at the point hit by the laser, and records data by means of this change.

The optical disc drive 100 uses feedback power control to constantly drive the laser at a desired power level, that is, monitors the laser emission power of the laser light source 16 in order to control the output light power to a constant level. The laser drive unit 20 shown in FIG. 1 is what provides this power control by monitoring the laser emission power of the laser light source 16 in the emission power monitor 1.

Figure 2:
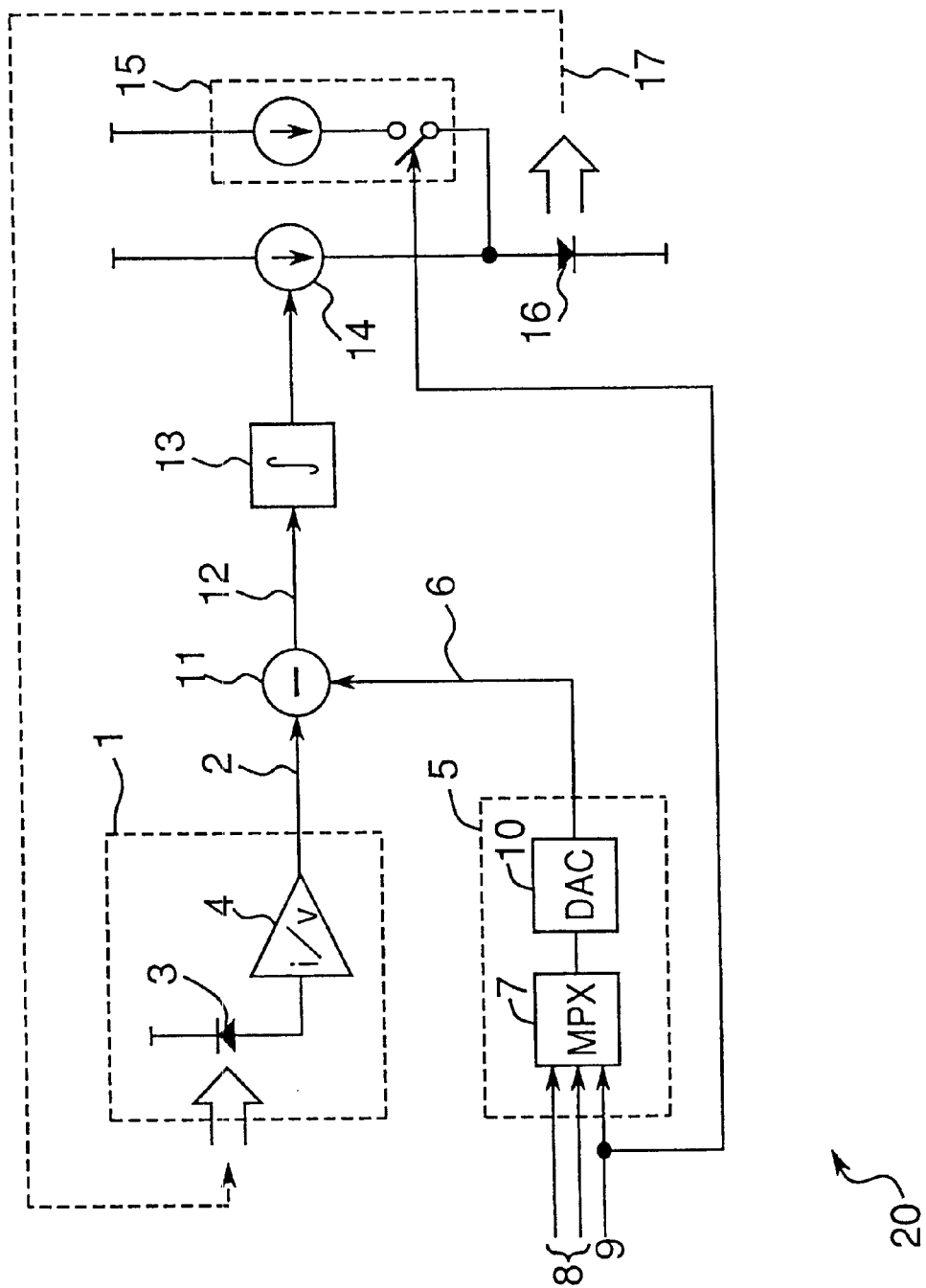
FIG. 2 is a block diagram of the laser drive unit according to the first embodiment.

The laser drive unit 20 is described in further detail next. FIG. 2 is a block diagram of the laser drive unit 20 in this first embodiment of the invention. The emission power monitor 1 of the laser drive unit 20 receives a laser beam output from the laser light source 16 through the collimation lens 102, transparent mirror 103, and collective lens 108. The received laser beam can be adjusted using the characteristics of the transparent mirror 103, and is, for example, 10% of the light output from the laser light source 16. It will be obvious that power control of the laser light source 16 must consider this change. The laser drive unit 20 controls the current flow to the laser light source 16 so that the power of the received laser beam is the specified power. The laser drive unit 20 has the emission power monitor 1, an expected value waveform generator 5, differential amplifier 11, integrator 13, bias current source 14, and pulse current source 15. Note that for convenience of the following description the laser light source 16 is also shown in FIG. 2.

These various elements are described next below. The emission power monitor 1 detects the strength of the actual light emitted from the laser light source 16, and generates a monitor wave 2. The monitor wave is defined by the time and voltage (monitor voltage) relationship. More specifically, the emission power monitor 1 has a pin diode 3 and i/v conversion circuit 4. The pin diode 3 receives the laser beam 17 from the laser light source 16 and detects the emission strength as current. The i/v conversion circuit 4 converts the output current from the pin diode 3 to a voltage, and outputs the monitor wave 2.

Synchronized to the input of record data, the expected value waveform generator 5 generates an expected wave of the light power obtained when a desirably power modulated laser beam is received and detected, and outputs expected voltage 6. The expected value waveform generator 5 has a power multiplexer (MPX) 7 and DA converter 10.

Figure 3A:
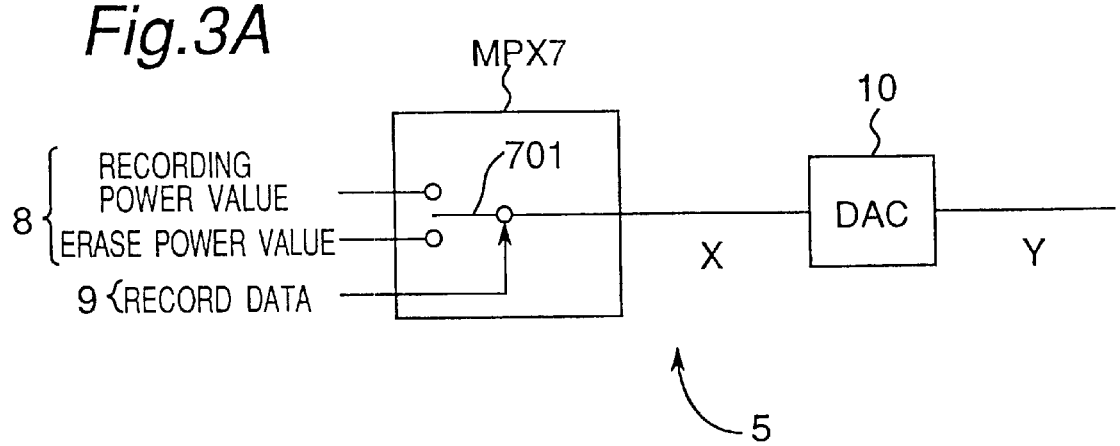
FIGS. 3A and 3B show the configuration and operation of the expected value waveform generator, FIG. 3A being a block diagram showing the configuration of the expected value waveform generator, and FIG. 3B being a timing chart showing the operation of the expected value waveform generator.
Figure 3B:
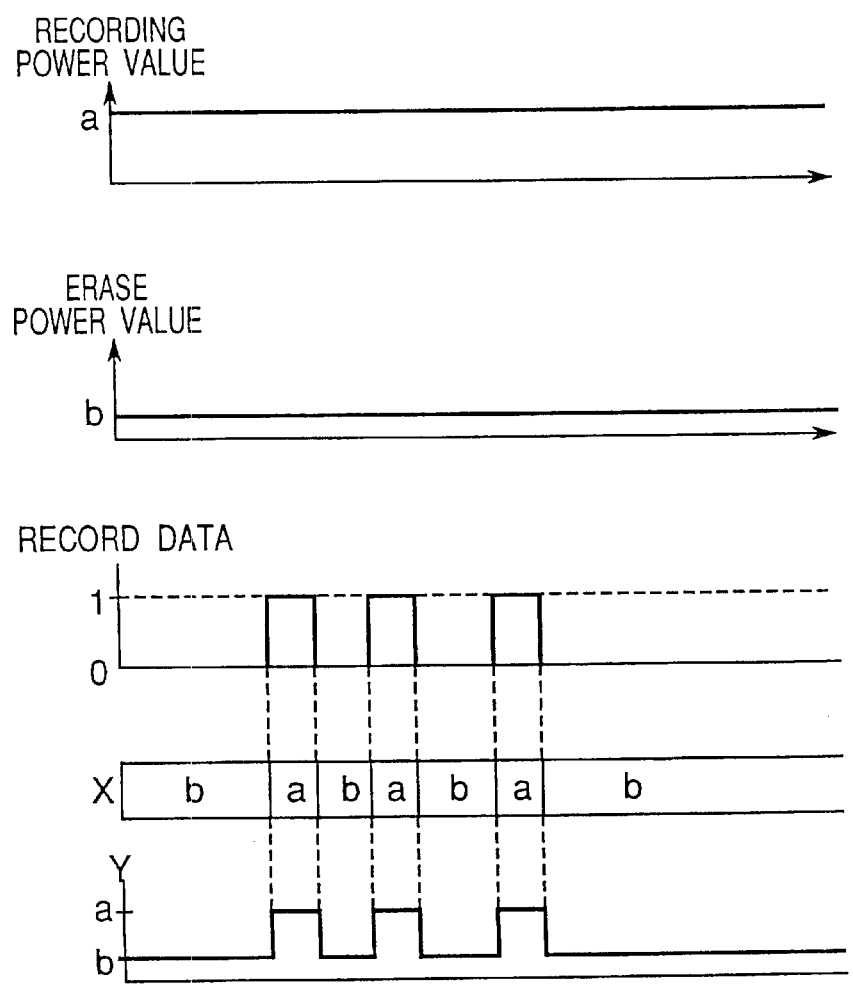

The expected value waveform generator 5 is described in further detail with reference to FIGS. 3A and 3B. FIGS. 3A and 3B show the configuration and operation of the expected value waveform generator 5, FIG. 3A being a block diagram showing the configuration of the expected value waveform generator 5. The power multiplexer 7 sets the power value 8 at each change in the output pulse. More specifically, the power multiplexer 7 switches switch 701 based on the record data 9 to send one of two power values 8 (that is, recording power and erase power values) representing the output pulse to the DA converter 10. The recording power and erase power values are both set based on various conditions (including temperature) for driving the laser light source 16 (FIG. 2), and are the ideal values for setting the desired beam power of the laser light source 16 (FIG. 2).

The DA converter 10 converts the output of the power multiplexer 7 to an analog voltage wave. Note that in this specification this analog voltage includes the expected voltage. FIG. 3B is a timing chart for the operation of the expected value waveform generator 5. Value a is supplied as the recording power value, and value b as the erase power value. The record data, which has a value of either 1 or 0, is input at a specific timing, and output X of the power multiplexer 7 goes to value b when the record data is a 0 and to value a when the record data is a 1. The DA converter 10 receives this output X, converts output value a to voltage a, and converts output value b to voltage b. The output Y from the DA converter 10 is shown on the bottom row in FIG. 3B.

Returning again to FIG. 2, the differential amplifier 11 obtains the difference of the expected voltage 6 from the expected value waveform generator 5 and the monitor voltage 2 from the i/v conversion circuit 4, and outputs differential voltage 12.

The integrator 13 integrates the differential voltages 12 output by the differential amplifier 11.

The bias current source 14 controls current flow according to the output voltage of the integrator 13. The bias current source 14 specifically comprises a resistance, power source, and transistor. That is, the a base electrode of the transistor is connected to the integrator 13 by way of the resistance that converts the output voltage from the integrator 13 to current. A collector electrode of the transistor is connected to the power source. An emitter electrode of the transistor is connected to the laser light source 16. The transistor can flow a collector current hfe times the base current. This hfe value is the dc current amplification rate, and is an approximate value determined for each transistor. For example, if a 1 mA base current flows to a transistor with an hfe of 100, a collector current of up to 100 mA can flow. The bias current source 14 thus controls the current according to the output voltage of the integrator 13.

Finally, the pulse current source 15 switches according to the record data 9. The laser light source 16 is current driven by the bias current source 14 and pulse current source 15.

Figure 4A:
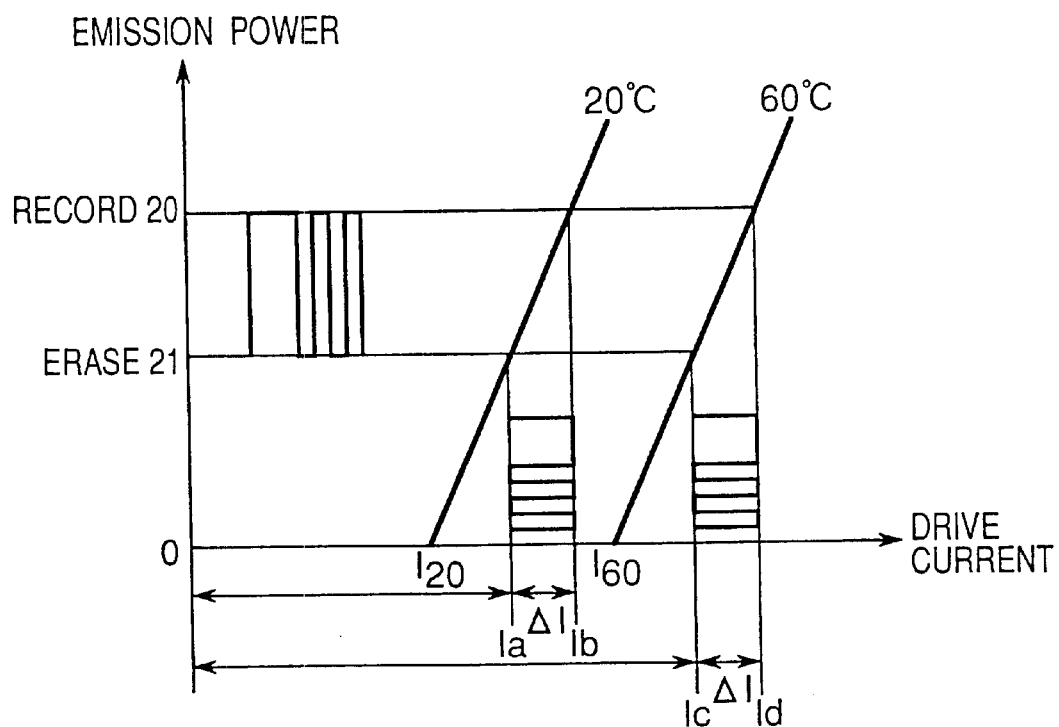
FIGS. 4A and 4B show the operating characteristics of the laser light source.

The characteristics of the laser light source 16 (FIG. 2) are described next. FIG. 4A shows the operating characteristics of the laser light source 16 (FIG. 2). The drive current of the laser light source is shown on the horizontal axis, and the laser beam emission power is on the vertical axis. The bold lines in the graphs indicate the relationship between emission power and the drive current to the laser light source 16. As shown in FIG. 4A, a typical laser light source does not emit until the current supply reaches a certain threshold level even though current is applied, and emission power then increases linearly at drive current above this threshold level. FIG. 4A shows the characteristics of a laser light source 16 (FIG. 2) for which the threshold current changes according to temperature. If we assume the temperature of the laser light source 16 (FIG. 2) to be 20 deg C., the threshold current is I20, and current Ib must be supplied to the laser light source 16 (FIG. 2). Current Ib is the sum of bias current Ia, which is equivalent to erase power 21, and pulse current ?I, which is equivalent to the difference between the erase and record power levels. When the temperature of the laser light source 16 (FIG. 2) is 60 deg C., the threshold current rises to I60, and to achieve the same recording power 20 and erase power 21, the bias current must increase to Ic while the pulse current 44 is the same as the pulse current ?I at 20 deg C.

The operation of the laser drive unit 20 (FIG. 2) according to this first embodiment of the invention is described next. FIGS. 5A to 5D show various signal waveforms. Time is shown on the horizontal axis in each graph in FIGS. 5A to 5D while the vertical axis shows laser emission power in FIG. 5A, expected voltage 6 in FIG. 5B, monitor voltage 2 in FIG. 5C, and differential voltage 12 in FIG. 5D. The laser light source 16 (FIGS. 1 and 2) pulse emits at the emission power levels shown in FIG. 5A, that is, at two levels, the recording power 20 and erase power 21 levels.

Figure 5A:
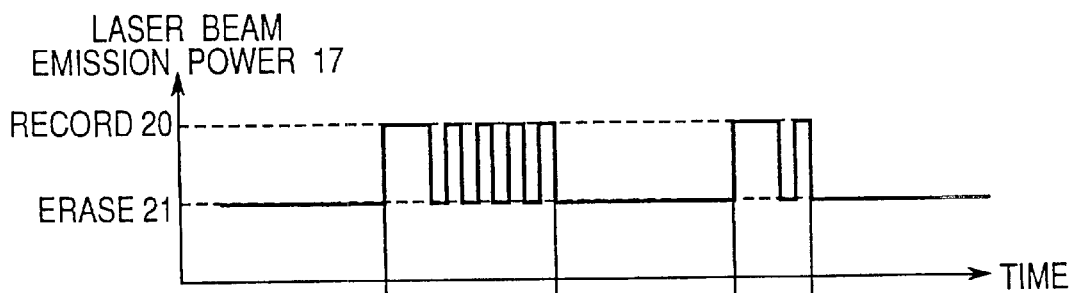
FIGS. 5A to 5D show various signal waveforms.
Figure 5B:
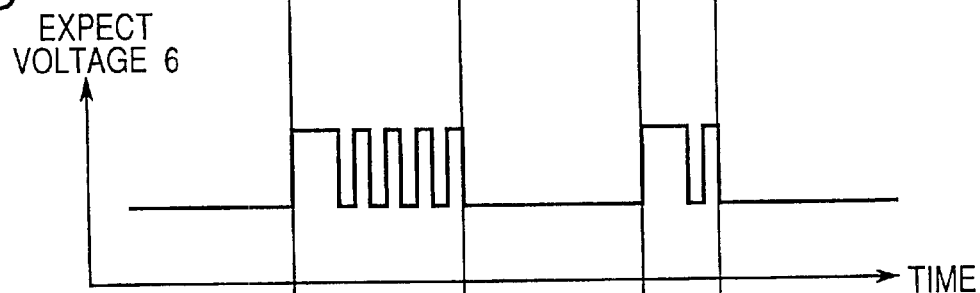
Figure 5C:
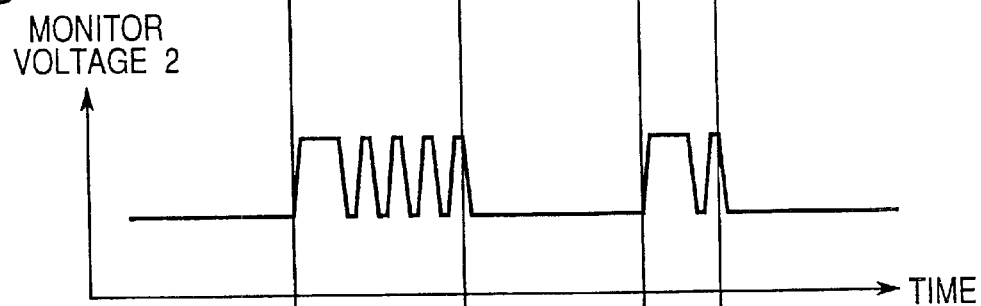
Figure 5D:
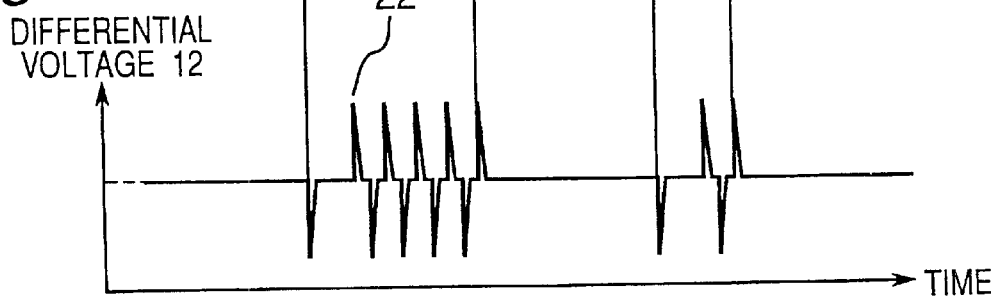

As shown in FIG. 5B, the expected value waveform generator 5 (FIG. 2) generates the expected voltage 6 so that it mimics the actual laser emission power 17 shown in FIG. 5A. The laser emission power is detected by the emission power monitor 1, and the monitor voltage 2 output from the emission power monitor 1 resembles the laser emission power 17 but both the rising and falling edges have a slight slope as shown in FIG. 5C. This slope results from the effects of the frequency characteristics of the photodetector (pin diode 3), which attenuates high frequencies. The differential voltage 12 of these two signals is therefore a wedge-shaped pulse train such as shown in FIG. 5D. The wedges are detected at both polarities, and are smoothed by the integrator 13 (FIG. 2). The output from the integrator 13 (FIG. 2) is thus the offset (difference) between the voltage direction (y-axis direction) of the two signals.

The laser drive unit 20 (FIG. 2) of this first embodiment of the invention therefore detects a positive differential voltage when the monitor voltage 2 is greater than the expected voltage 6, that is, when the actual laser power is greater than the desired power. Laser power then drops at this time because the output of the integrator 13 causes the current supply from the bias current source 14 to drop. Conversely, when the monitor voltage 2 is less than the expected voltage 6, that is, the actual laser power is less than the desired power, the differential voltage is detected negative. In this case the output from the integrator 13 causes the current output from the bias current source 14 to rise, and laser power therefore also rises. It is therefore possible to control the laser to emit at a constant power level even when the threshold current needed to achieve a desired power level changes when the temperature of the laser beam changes as shown in FIG. 4A.

Embodiment 2

A laser drive unit according to the second embodiment of this invention described below differs from the above first embodiment in that a low pass filter is added to the expected value waveform generator 5 (FIG. 2) and to the emission power monitor 1 (FIG. 2) in the first embodiment. These low pass filters are bandwidth-limiting filters to output the expected voltage and monitor voltage in substantially the same bands. Using these low pass filters also makes it possible to more precisely detect the difference between the monitor wave and the expected wave.

Figure 6:
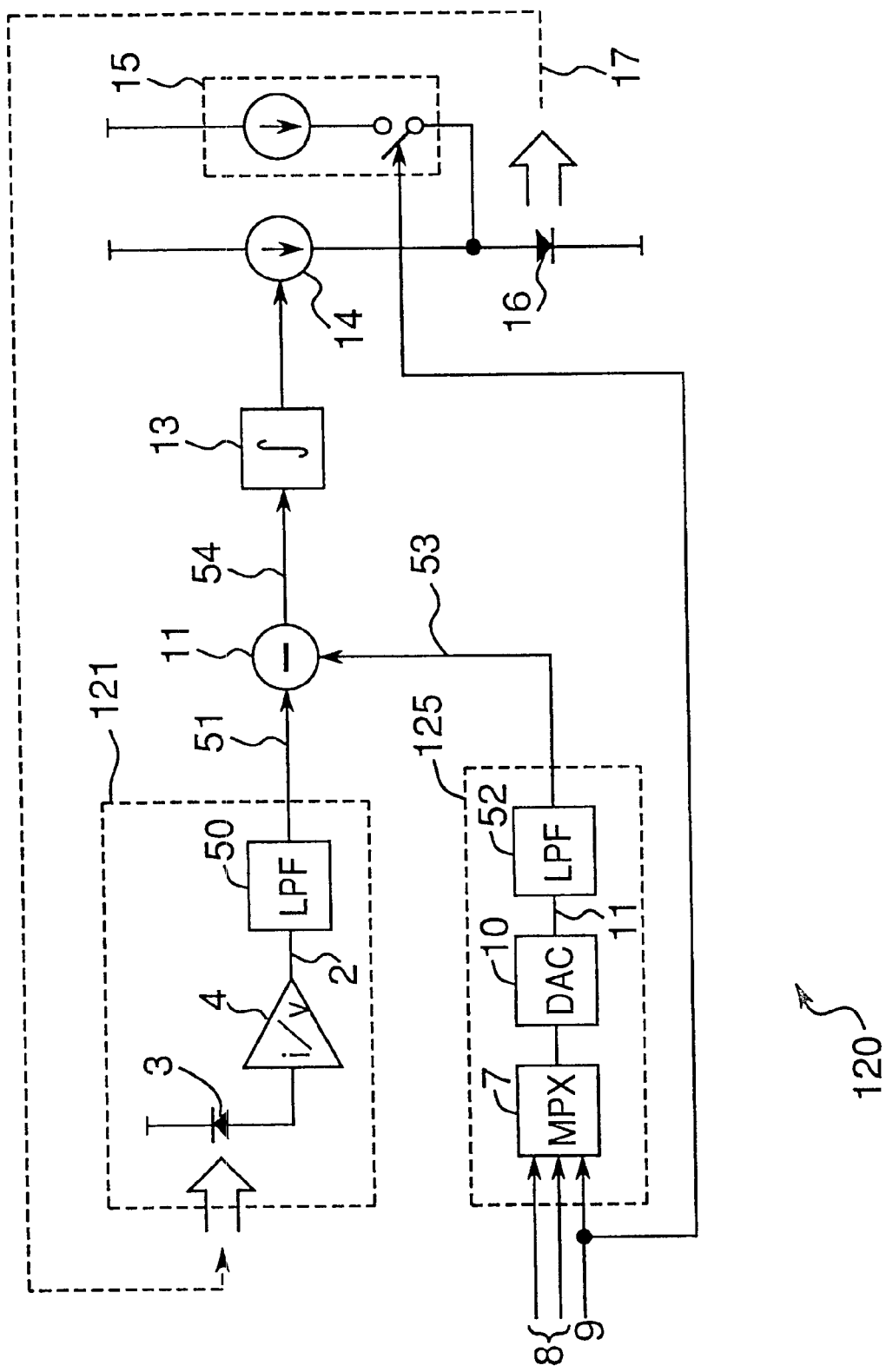
FIG. 6 is a block diagram of the laser drive unit according to a second embodiment of the invention.

FIG. 6 is a block diagram of a laser drive unit 120 according to this second embodiment of the invention. As noted above, the difference between this laser drive unit 120 and the laser drive unit 20 shown in FIG. 2 is the addition of a low pass filter (LPF) to the emission power monitor 1 and expected value waveform generator 5 of the laser drive unit 20 shown in FIG. 2. The emission power monitor and expected value waveform generator additionally comprising a low pass filter are referred to below as emission power monitor 121 and expected value waveform generator 125.

The configuration of this laser drive unit 120 is described next in relation to these differences. The low pass filter 50 of the emission power monitor 121 converts the output 2 of the i/v conversion circuit 4 to a bandwidth-limited monitor voltage 51. The low pass filter 52 of the expected value waveform generator 125 converts the output 11 of the DA converter 10 to a bandwidth-limited expected voltage 53. Both low pass filters 50 and 52 have the same frequency characteristic (bandpass characteristic). The differential amplifier 11 generates differential voltage 54 from the bandwidth-limited monitor voltage 51 and the bandwidth-limited expected voltage 53. As in the first embodiment, the differential voltage 54 is input to the integrator 13. The bias current source 14 controls current flow according to the output from the integrator 13.

Operation of this laser drive unit 120 is described next with reference to FIGS. 7A to 7D. FIGS. 7A to 7D show various signal waveforms. The laser light source 16 (FIG. 6) pulse emits at the emission power levels shown in FIG. 7A, that is, at two levels, the recording power 20 and erase power 21 levels.

Figure 7A:
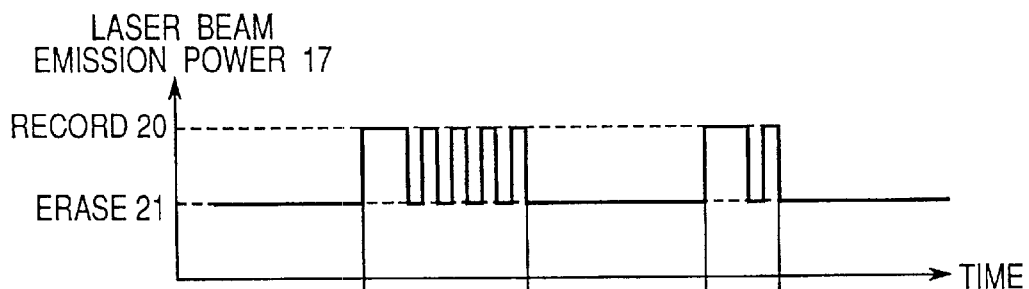
FIGS. 7A to 7D show various signal waveforms.
Figure 7B:
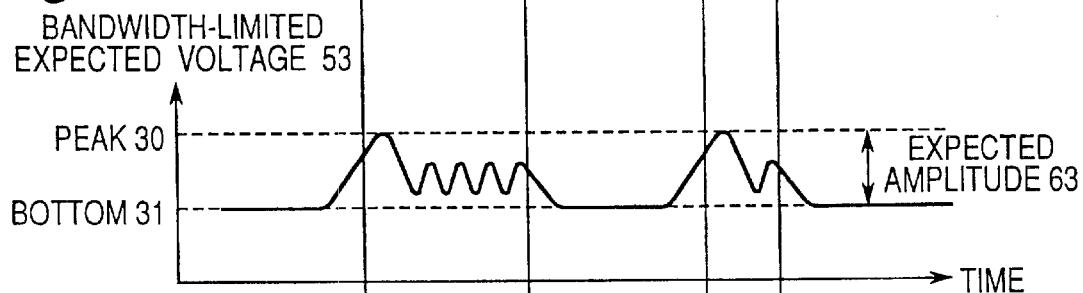
Figure 7C:
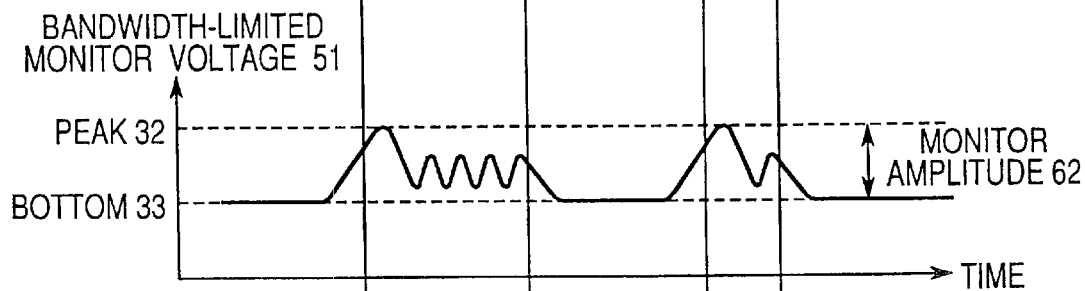
Figure 7D:
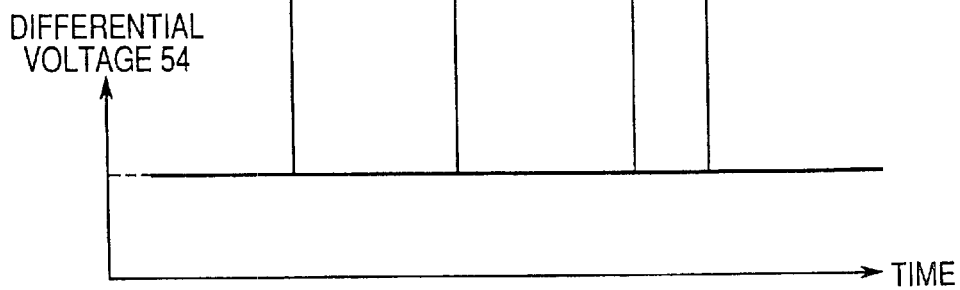

The expected value waveform generator 125 (FIG. 6) bandwidth-limits the actual laser emission power 17 and generates the expected voltage 53 with a gradual slope and peaks as shown in FIG. 7B. The emission power monitor 121 (FIG. 6) also detects the actual laser emission power 17 to generate the monitor voltage 51, which is bandwidth-limited similar to the expected voltage 53 and therefore has the similar gradual waveform as shown in FIG. 7C. As a result, as shown in FIG. 7D, only the offset voltage component of the voltage direction (vertical direction) of the two signals is detected from the differential voltage 54 of these two signals.

As in the first embodiment above, the laser drive unit of this second embodiment can therefore emit a laser light source constantly at a specified power level even if the threshold current required to achieve a specific voltage changes when the laser temperature changes.

It is also possible to eliminate local disturbances in the difference detection wave as a result of the low pass filters provided in the emission power monitor and expected value waveform generator to equally limit the bandwidths of the output signals from the emission power monitor and expected value waveform generator. This is particularly advantageous when it is desirable to increase the power control response speed of the laser drive unit.

Embodiment 3

The relationship between the drive current and emission power of a laser light source is typically linear, and a laser drive unit according to a third embodiment of this invention handles changes in the characteristics of the laser when the slope of this linear relationship changes with temperature. It will also be noted that this third embodiment of the invention also includes the features of the first and second embodiments above, and therefore also provides the advantages achieved by the first and second embodiments.

Figure 8:
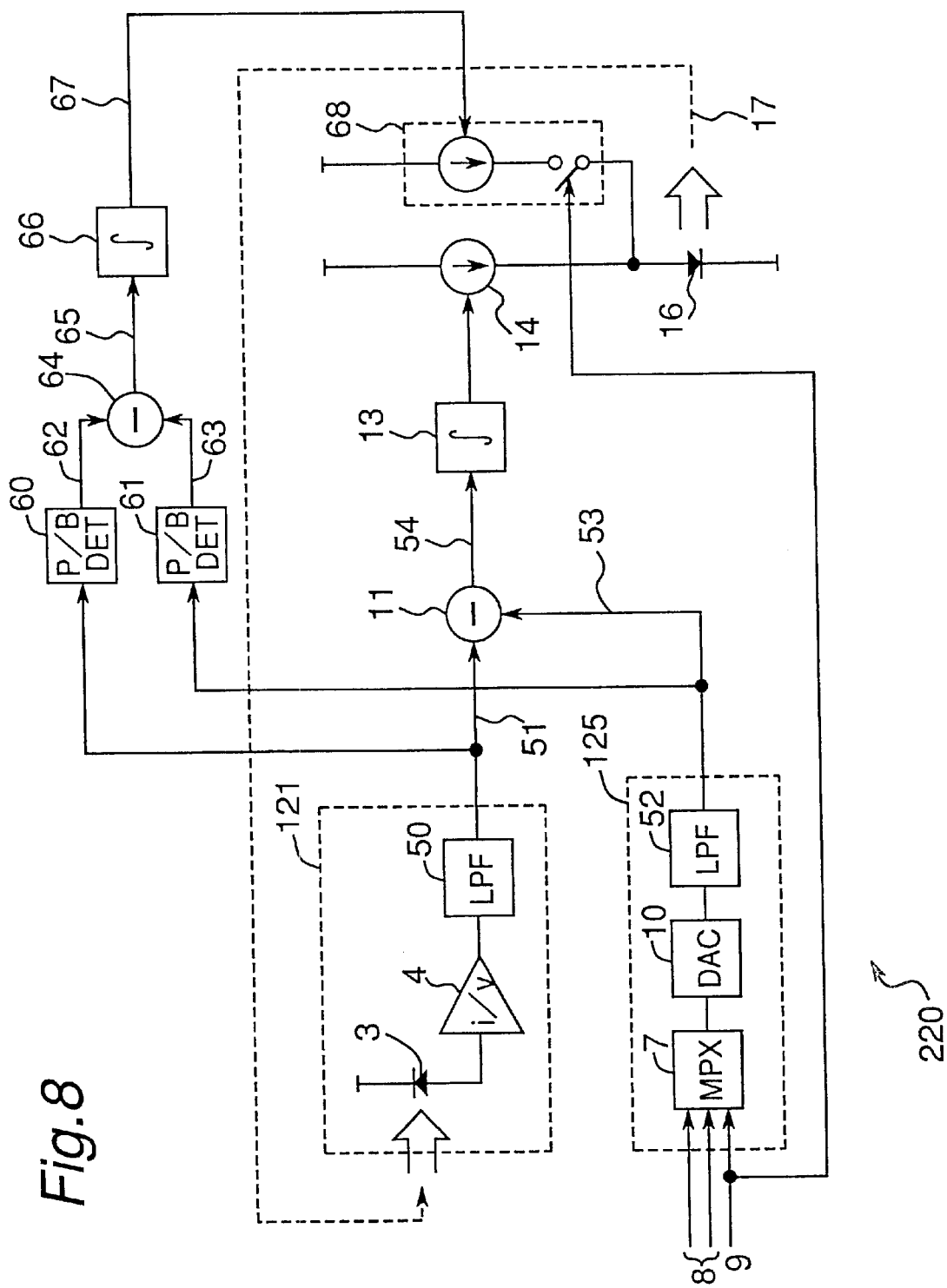
FIG. 8 is a block diagram of the laser drive unit according to a third embodiment of the invention.

FIG. 8 is a block diagram of a laser drive unit 220 according to this third embodiment of the invention. This laser drive unit 220 differs from the laser drive unit 120 shown in FIG. 6 in further comprising an amplitude detector 60, expected amplitude detector 61, differential operator 64, integrator 66, and pulse current source 68.

The configuration of this laser drive unit 220 is described next in relation to these differences. The amplitude detector 60 detects the peak-to-bottom voltage difference of the bandwidth-limited monitor voltage 51, and outputs the result as monitor amplitude 62. The expected amplitude detector 61 detects the peak-to-bottom voltage difference of the bandwidth-limited expected voltage 53, and outputs the result as expected amplitude 63. The differential operator 64 outputs the difference voltage 65 of the monitor amplitude 62 and expected amplitude 63. The integrator 66 integrates the difference voltage 65 and outputs the pulse current source control voltage 67. The pulse current source 68 switches according to the record data 9, and controls (adjusts) the current flow according to the control voltage 67.

Figure 4B:
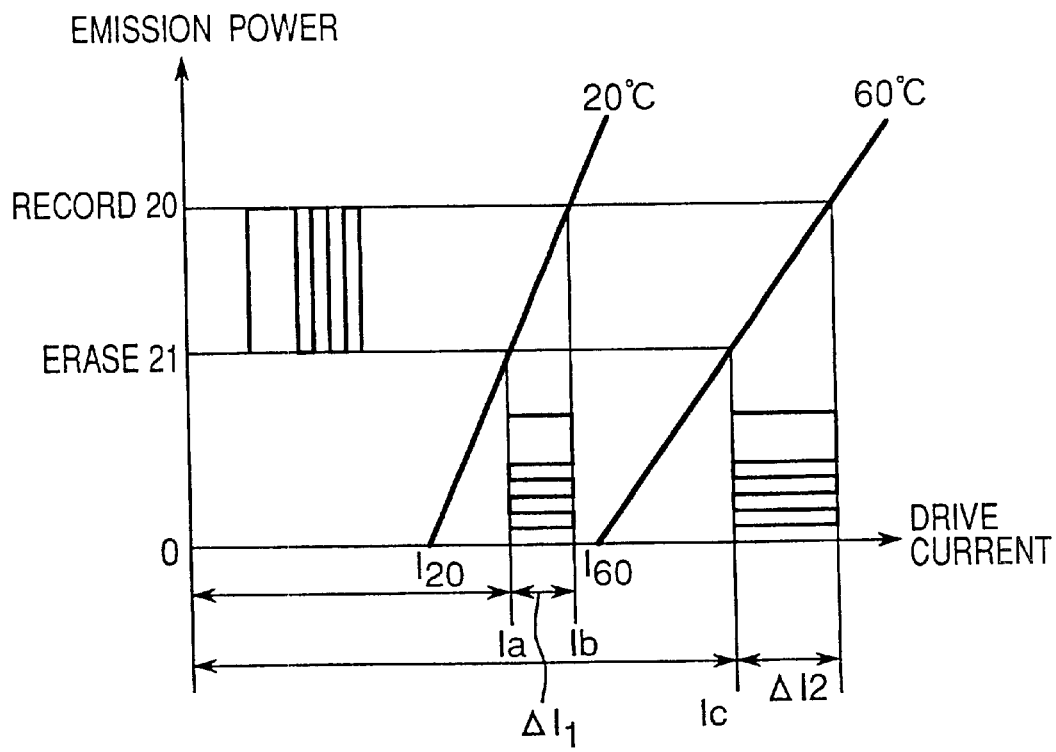

The characteristics of the laser light source 16 (FIG. 8) are described next. FIG. 4B shows the operating of the laser light source 16 shown in FIG. 8. The drive current of the laser light source is shown on the horizontal axis, and laser beam emission power is on the vertical axis. The bold lines in the graphs indicate the relationship between emission power and the drive current to the laser light source 16. FIG. 4B shows the characteristics of a laser for which the threshold current and the slope of the line indicating the relationship between threshold current and emission power vary according to temperature. If the laser temperature is 20 deg C., for example, the threshold current is I48, and it is necessary to supply to the laser current equal to the sum of bias current Ia, which is equivalent to erase power 21, and pulse current ?I1, which is equivalent to the difference between the erase and record power levels. If the laser temperature is 60 deg C., the threshold current rises to I60, and to achieve the same erase power 21, the bias current must increase to Ic. Furthermore, the change in the slope of the threshold current-emission power curve indicates that in order to achieve the same recording power 20, a pulse current ?I2 greater than the pulse current ?I1 at 20 deg C. is required.

Operation of the laser drive unit 220 (FIG. 8) according to this third embodiment is described next. It is assumed that a laser at the emission power shown in FIG. 5A pulse emits at two power levels, the recording power 20 and the erase power 21 levels.

As shown in FIG. 7B, the expected voltage 53 (FIG. 8) generated by the expected value waveform generator 125 (FIG. 8) is a gradual waveform of the bandwidth-limited actual laser emission power 17. Likewise, the monitor voltage 51 detected by the emission power monitor 121 (FIG. 8) is bandwidth-limited identically to the expected voltage 53 and therefore has the same gradual waveform as shown in FIG. 7C. As a result, as shown in FIG. 7D, the offset voltage of the voltage direction (vertical direction) of the two signals is detected from the differential voltage 54 of these two signals.

As in the second embodiment above, the laser drive unit of this third embodiment can therefore emit a laser light source 16 (FIG. 8) at a specified power level by controlling the bias current source even if the threshold current required to achieve a specific voltage changes due to a change in the laser temperature. It will be noted that what is controlled, however, is the average laser beam power and not the peak value of the pulses.

The principle whereby the present invention controls the peak value of the pulses is therefore described next.

The pulse peak value can be adjusted by the pulse current source 68 (FIG. 8). As shown in FIG. 7B, the bandwidth-limited expected voltage 53 generated by the expected value waveform generator 5 (FIG. 8) has a peak voltage 30 and a bottom voltage 31. This means the peak-to-bottom voltage can be determined. This voltage is referred to as the expected amplitude 63. The expected amplitude 63 is detected by the expected amplitude detector 61 (FIG. 8). As also shown in FIG. 7C, the bandwidth-limited monitor voltage 51 generated by the emission power monitor 121 (FIG. 8) likewise has a peak voltage 32 and bottom voltage 33, and the peak-to-bottom voltage therebetween can therefore also be determined. This voltage is referred to as the monitor amplitude 62, which is detected by the amplitude detector 60 (FIG. 8).

The differential operator 64 (FIG. 8) obtains the difference between the expected amplitude 63 and monitor amplitude 62, and outputs difference voltage 65. The difference voltage 65 is indicative of the amplitude difference between pulses in the expected wave and the monitor wave. The difference voltages 65 are integrated by the integrator 66, converted to a control voltage 67, and then used to adjust the current flow of the pulse current source 68.

With a laser drive unit according to this third embodiment of the invention as described above, when the monitor amplitude 62 is greater than the expected amplitude 63, that is, when the pulse amplitude of the laser emission power 17 is greater than a desired amplitude, the difference voltage 65 is detected positive, and the output from the integrator 66 decreases the current flow from the pulse current source 68. This works to reduce the pulse amplitude.

Conversely, if the monitor amplitude 62 is less than the expected amplitude 63, that is, when the pulse amplitude of the laser emission power 17 is less than a desired amplitude, the difference voltage 65 is detected negative, and the output from the integrator 66 increases the current flow from the pulse current source 68. This works to increase the pulse amplitude.

It is therefore possible with this third embodiment of the invention to control the bias current source and pulse current source so that the laser constantly pulse emits at a specified power level even if the both the threshold current required to achieve a specific power level and the slope of the threshold current to emission power curve change when the laser temperature changes as shown in FIG. 6B.

It should be noted that input to the differential amplifier 11 first passes through the low pass filters 50 and 52 in this third embodiment, but the location of the low pass filters 50 and 52 can be changed. For example, the low pass filters can be disposed after branching to the amplitude detector 60 and expected amplitude detector 61 and before input to the amplitude detector 60 and expected amplitude detector 61. This will result in the emission power monitor 121 and expected value waveform generator 125 being configured identically to the emission power monitor 1 and expected value waveform generator 5 of the first embodiment shown in FIG. 2. The configuration will therefore be the same as the laser drive unit 20 in FIG. 2 except for branching to the amplitude detector 60 and expected amplitude detector 61.

Figure 9A:
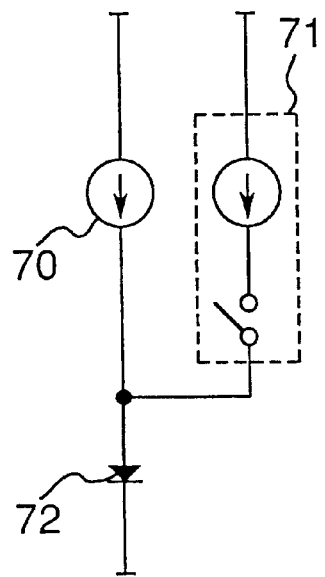
FIGS. 9A and 9B show the connection between the current source and laser light source.
Figure 9B:
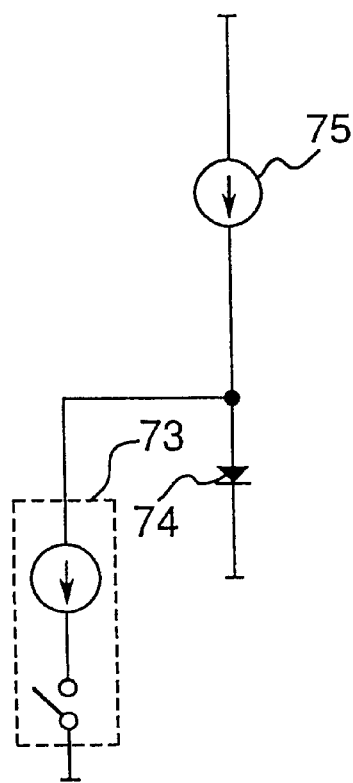

The relationship between the current source and laser light source in the laser drive units according to these first to third embodiments is described next with reference to FIGS. 9A and 9B. FIGS. 9A and 9B show the connection between the current source and the laser light source. In the embodiments described above the bias current source 70 and pulse current source 71 are parallel connected as shown in FIG. 9A, and the laser light source 72 is driven by the combined current of both the bias and pulse current sources. Alternatively, however, a configuration as shown in FIG. 9B could be used. In this case the pulse current source 73 is parallel connected to the laser light source 74, the bias current source 75 supplies all current with the pulse part of this current supply diverted to the pulse current supply 73.

These preferred embodiments have been described with laser drive according to the present invention used in an optical disc drive. It will be obvious, however, that the present invention can also be used in laser printers requiring laser light source control, optical monitors for communication lasers, and other applications requiring laser control.

The laser drive method and laser drive system according to the present invention can constantly and continuously control the power of a pulse-emitting laser without using test emission feedback or a high speed sample hold circuit. The laser drive method and laser drive system of the present invention can therefore be used in an optical disc drive to achieve an extremely high data recording rate and recording efficiency.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A laser drive method comprising:

detecting beam emission power from a light source and generating a monitor wave;

receiving data;

generating an expected wave for the beam power based on the received data;

calculating a waveform difference between the generated monitor wave and the expected wave;

controlling current flow from a bias current source based on the calculated waveform difference; and emitting a beam from the light source based on the controlled current flow of the bias current source.

2. A laser drive method as described in claim 1, wherein the emitting comprises emitting a beam from a light source based on current flow of a pulse current source that switches according to the received data.

3. A laser drive method as described in claim 2, further comprising limiting bandwidths of the monitor wave and the expected wave to substantially the same.

4. A laser drive method as described in claim 3, further comprising:

detecting and outputting as a monitor amplitude a peak-to-bottom difference of the bandwidth-limited monitor wave;

detecting and outputting as an expected amplitude a peak-to-bottom difference of the bandwidth-limited expected wave;

determining an amplitude difference of the output monitor amplitude and the output expected amplitude; and adjusting the current flow of the pulse current source based on the determined amplitude difference.

5. A laser drive system comprising:

an emission power monitoring unit which detects beam emission power from a light source and generating a monitor wave;

an expected waveform generating unit which receives data and based on the received data generating an expected wave for the beam power;

a differential operator which calculates a waveform difference between the monitor wave generated by the emission power monitoring unit and the expected wave generated by the expected waveform generating unit;

a bias current source which controls current flow based on the waveform difference calculated by the differential operator;

the laser drive system emitting a beam from the light source based on the current flow controlled by the bias current source.

6. A laser drive system as described in claim 5, further comprising:

a pulse current source that is switched according to the received data and adjusts current flow;

the laser drive system emitting a beam from the light source based on the current flow controlled by the bias current source and the current flow adjusted by the pulse current source.

7. A laser drive system as described in claim 6, further comprising two filters which limit bandwidths of the monitor wave and the expected wave to substantially the same.

8. A laser drive system as described in claim 7, further comprising:

- a monitor amplitude detecting unit which detects and outputting as a monitor amplitude a peak-to-bottom difference of the bandwidth-limited monitor wave;
- an expected amplitude detecting unit which detects and outputs as an expected amplitude a peak-to-bottom difference of the bandwidth-limited expected wave;
- an amplitude differential operator which determines an amplitude difference between the monitor amplitude output from the monitor amplitude detecting unit and the expected amplitude output from the expected amplitude detecting unit;
- the pulse current source adjusting the current flow based on the amplitude difference determined by the amplitude differential operator.

* * * * *